United States Patent
Reddy et al.

[11] Patent Number: 6,126,459
[45] Date of Patent: Oct. 3, 2000

[54] SUBSTRATE AND ELECTRICAL CONNECTOR ASSEMBLY

[75] Inventors: Prathap Amerwai Reddy, Farmington Hills; Cuong Van Pham, Northville; Brian John Hayden, Royal Oak; Daniel Edward Farnstrom, Redford, all of Mich.

[73] Assignee: Ford Motor Company, Dearborn, Mich.

[21] Appl. No.: 08/822,535

[22] Filed: Mar. 24, 1997

[51] Int. Cl.⁷ .................................................. H01R 9/09
[52] U.S. Cl. ............................................. 439/77; 439/247
[58] Field of Search ........................... 439/77, 247, 248, 439/931; 174/254

[56] References Cited

U.S. PATENT DOCUMENTS

| | | | |
|---|---|---|---|
| H842 | 11/1990 | Ochs | 357/68 |
| 4,413,308 | 11/1983 | Brown | 361/398 |
| 4,547,834 | 10/1985 | Dumont et al. | 361/386 |
| 4,789,348 | 12/1988 | Hampton | 439/142 |
| 4,910,641 | 3/1990 | Yanase | 361/364 |
| 5,144,742 | 9/1992 | Lucas et al. | 174/254 |
| 5,170,326 | 12/1992 | Meny et al. | 361/395 |
| 5,206,463 | 4/1993 | DeMaso et al. | 174/254 |
| 5,265,322 | 11/1993 | Fisher et al. | 29/848 |
| 5,397,239 | 3/1995 | Zaderej et al. | 439/55 |
| 5,434,362 | 7/1995 | Klosowiak et al. | 174/254 |
| 5,495,076 | 2/1996 | Davis | 174/254 |
| 5,527,187 | 6/1996 | Jurasek et al. | 439/247 |

FOREIGN PATENT DOCUMENTS

| | | |
|---|---|---|
| 3141864 | 10/1981 | Germany . |
| 166990A | 3/1989 | Japan . |
| 1204495 | 8/1989 | Japan . |
| 1319993 | 12/1989 | Japan . |
| 335586A | 2/1991 | Japan . |
| 247547A | 4/1986 | United Kingdom . |

*Primary Examiner*—Khiem Nguyen
*Assistant Examiner*—Son V. Nguyen
*Attorney, Agent, or Firm*—Mark L. Mollon

[57] ABSTRACT

A substrate and electrical connector assembly including a unitary panel structure with metal conductors having a rigid main body portion, a rigid marginal edge portion, and a thin flexible section extending between the rigid main body portion and the rigid marginal edge portion. The assembly also includes an at least one conductive lead deposited on a surface of the plastic panel structure which extends from the rigid main body portion across the flexible section to the rigid marginal edge portion. Further included is an at least one conductive terminal affixed to the rigid marginal edge portion which is in electrical connection with the at least one conductive lead. The at least one conductive terminal is adapted to receive a mating connector. The flexible section enables the rigid marginal edge portion to move relative to the rigid main body portion.

15 Claims, 4 Drawing Sheets

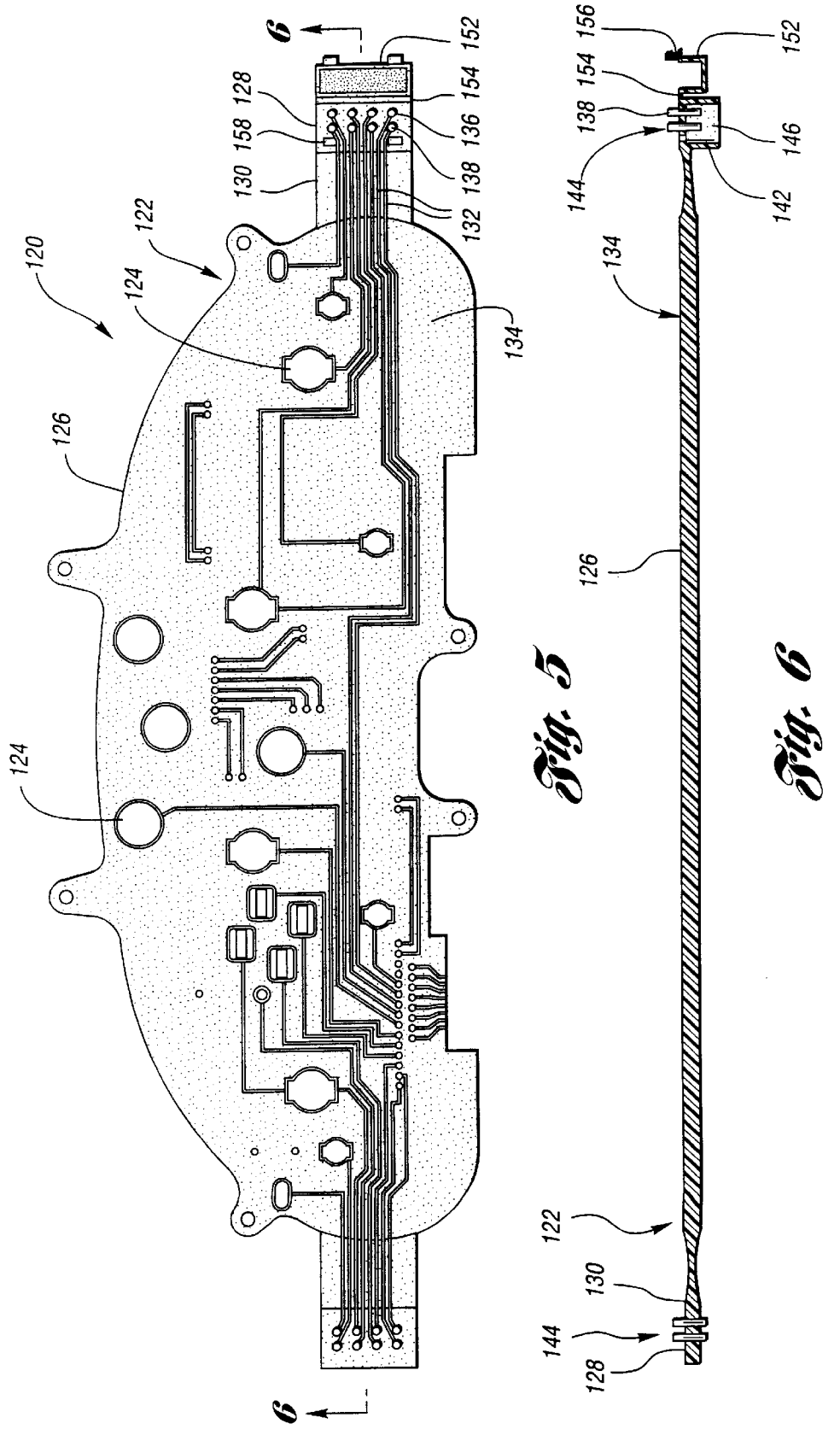

SUBSTRATE AND ELECTRICAL CONNECTOR ASSEMBLY

TECHNICAL FIELD

This invention relates to a substrate and electrical connector assembly.

BACKGROUND ART

Wiring harnesses and conventional connectors typically add cost, complexity and bulkiness to electronic packaging in automotive electrical systems. In many areas of the vehicle, there may be insufficient clearance to pass the wiring harness between fixed vehicle components. This is especially true in smaller areas of the vehicle where space is a premium, such as the instrument panel area, where many of the vehicles electrical components and gadgetry are located. Most of the major vehicle wiring harnesses originate behind the instrument panel.

The major vehicle wiring harnesses are connected to branch harnesses by multiterminal connectors. The point of termination of each connector is determined by the placement of electronic components and the routing of the harness. Wiring harness routing is designed as a part of the total automotive electrical system. The routing must pass through and around channels, braces, components, and other parts in order to avoid damage to the wires. In addition, the electrical components are commonly exposed to dust, dirt and other environmental contaminants which may effect the durability and life of the connectors. Further, normal vibration and differences in thermal expansion between mating parts and other physical factors may affect the connector's stability. Electrical connectors are also frequently difficult to assemble due to tight tolerances and misalignment of mating components.

Manufacturers have attempted to provide alternatives to wiring harnesses in electronic packaging. See for example U.S. Pat. No. 5,527,187 issued to Jurasek et al. and U.S. Pat. No. 5,397,239 issued to Zaderej et al., both assigned to the assignee of the present invention. However, these patents do not address the focus of the present invention.

Consequently, there exists a need for an integrated substrate and electrical connector assembly wherein the integration of connectors into a molded substrate serves as a replacement for bulky wiring harnesses. This assembly should also be sufficiently flexible to allow mating components to be easily assembled thereto. Such an assembly should also provide for relative ease of service and maintenance, thereby resulting in a lower piece price, labor costs as well as reduced warranty costs. This assembly should further allow for a more accurate means of locating and positioning the connector in cooperation with a mating connector.

SUMMARY OF THE INVENTION

Accordingly, it is a principle object of the present invention to provide a substrate and electrical connector assembly which includes an integrally molded flexible portion for allowing the assembly to be flexible and to resolve misalignment concerns with mating components.

Further, it is an object of the present invention to provide for an electrical assembly in place of a bulky wiring assembly.

It is another object of the present invention to provide an substrate and electrical connector assembly which allows for ease of assembly and maintenance and results in a lower piece price, labor and warranty costs.

It is yet another object of the present invention to provide a substrate and electrical connector assembly which provides environmental and physical protection to the electronic components incorporated into the assembly.

It is still a further object of the present invention to provide a substrate and electrical connector assembly having an integrally molded connector according to the present invention.

It is still another object of the present invention to provide a molded instrument panel assembly having an integrally molded connector according to the present invention for taking the place of bulky vehicle wiring harnesses.

In carrying out the above objects, features and advantages of the present invention, there is provided a substrate and electrical connector assembly which includes a unitary substrate having a relatively rigid main body portion, a relatively rigid marginal edge portion, and a thin flexible section. This thin flexible section extends between the rigid main body portion and the rigid marginal edge portion. The flexible section enables the rigid marginal edge portion to move relative to rigid main body portion There is also provided at least one conductive lead which is deposited on a surface of the substrate. This lead extends from the rigid main body portion across the flexible section to the rigid marginal edge portion. There is further provided in this assembly at least one conductive terminal which is affixed to the rigid marginal edge portion. The terminal is in electrical connection with the at least one conductive lead. The at least one conductive terminal is adapted to receive a mating connector.

In one embodiment, the assembly also includes a housing and cover attached to the rigid marginal edge portion for partially enclosing and providing protection to the at least one conductive terminal. The housing may also be polarized for receiving the mating connector in a single orientation. The housing and cover may be integrally molded with the substrate and be of the same material or different material as the substrate. Further, the housing and cover may form a separate sub-assembly which is affixed to or engages the substrate and may also be of the same or different material as the substrate. In another embodiment, there is provided a substrate and connector assembly having more than one flexible section. In a preferred embodiment, there is provided an instrument panel and connector assembly, wherein the substrate is an instrument panel for a vehicle.

The above objects and other objects, features and advantages of the present invention are readily apparent from the following detailed description of the best modes for carrying out the invention when taken in connection with the accompanying drawings wherein like reference numerals correspond to like components.

BRIEF DESCRIPTION OF THE DRAWINGS

FIG. 5 is a plan view of a third embodiment of a substrate and connector assembly according to the present invention, wherein the substrate is shown as an instrument cluster; and FIG. 6 is a side view taken along the line 6—6 of FIG. 5 according to the present invention.

BEST MODES FOR CARRYING OUT THE INVENTION

Figure 1:
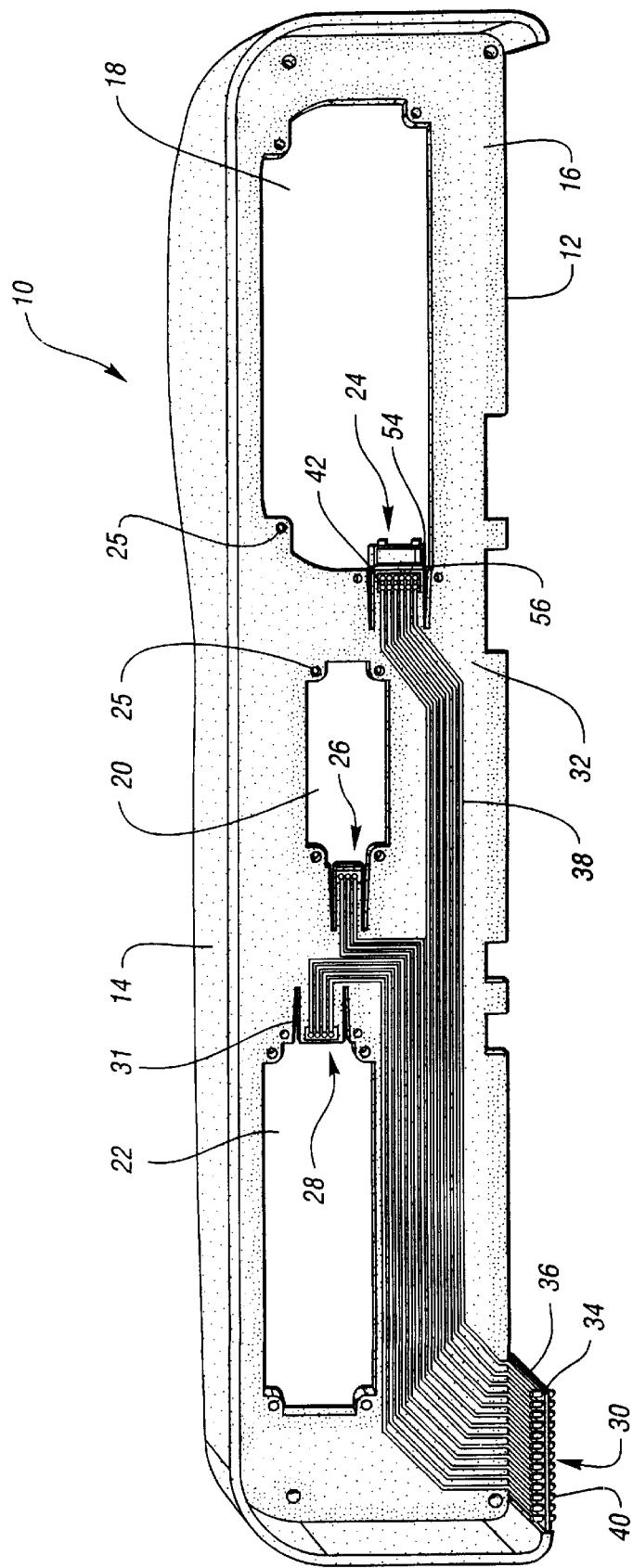
FIG. 1 is an elevational view of the rear surface of a molded instrument panel assembly according to the present invention.

Referring to FIG. 1, in accordance with the present invention there is shown a complete substrate and connector assembly 10. Preferably, and as shown in FIG. 1, the substrate and connector assembly 10 is a molded instrument panel assembly, wherein unitary substrate 12 is an instrument panel substrate for a motor vehicle. The teachings of the present invention are particularly applicable to instrument panel substrate 12, because in use, automotive wiring harnesses are typically crowded behind the instrument panel of the vehicle. However, instrument panel substrate 12 is shown by way of example and not limitation, because as further illustrated in FIGS. 5 and 6, discussed herein, substrate 12 may also be utilized in numerous applications which require electronic connections and where it is feasible to have such connections molded into substrate 12. For example, FIGS. 5–6 illustrate the substrate as an instrument cluster 122, discussed further herein.

Referring against to FIG. 1, instrument panel 12 has an outer surface 14 and an inner surface 16. Outer surface 14, which is only partially shown in FIG. 1, is visible by occupants of the motor vehicle in which instrument panel 12 is situated. Inner surface 16 is the surface of the instrument panel on which the teachings of the present invention is practiced. Of course, depending on the application of the substrate used and the practicality thereof, the invention can be practiced on either surface. Instrument panel 12 includes various openings, which, again, by way of example and not limitation, include instrument cluster opening 18, radio opening 20, and passenger side airbag opening 22. These openings are sized to receive a corresponding component; for example instrument cluster opening 18 can receive instrument cluster assembly 120 shown and discussed herein in relation to FIGS. 5 and 6.

Illustrated further in FIG. 1, each opening has a corresponding connector sub-assembly in accordance with the present invention. Cluster connector sub-assembly 24 is situated proximate instrument cluster opening 18 to provide electrical connection to the instrument cluster (not shown in FIG. 1); radio connector sub-assembly 26 is situated proximate radio opening 20 to provide an electrical connection to the radio (not shown), and airbag connector sub-assembly 28 is situated proximate airbag opening 22 to provide an electrical connection to the airbag electronics (not shown). Further provided at the edge of instrument panel 12 is edge connector sub-assembly 30 which is situated to mate with other connectors or harness connectors in order to electrically connect the instrument panel to other areas of the vehicle. Of course, the quantity of connector assemblies utilized and their positioning on the substrate depend on the application, as well as on molding considerations. Each of the connector assemblies 24, 26 and 28 is surrounded by a slit 31 or other opening in substrate 12 adjoining openings 18, 20 and 22 in order to provided flexibility to the connector assemblies and particularly to the flexible section 36 discussed further herein.

Instrument panel substrate 12 is typically injection molded and may be formed from a number of thermoplastics well-known in the art for molding rigid parts; thermoset or other plastic materials well-known in the art for this type of application can also be used. Injection molding is a common process for forming such parts. Substrate 12 has attached to it electronic components (not shown) available to perform various functions of the instrument panel and those electronic components attached to the instrument panel, such as the radio. Because of these electronic components, substrate 12 contains numerous attachment holes 25 for attachment of the electronic components to the substrate 12.

Figure 2:
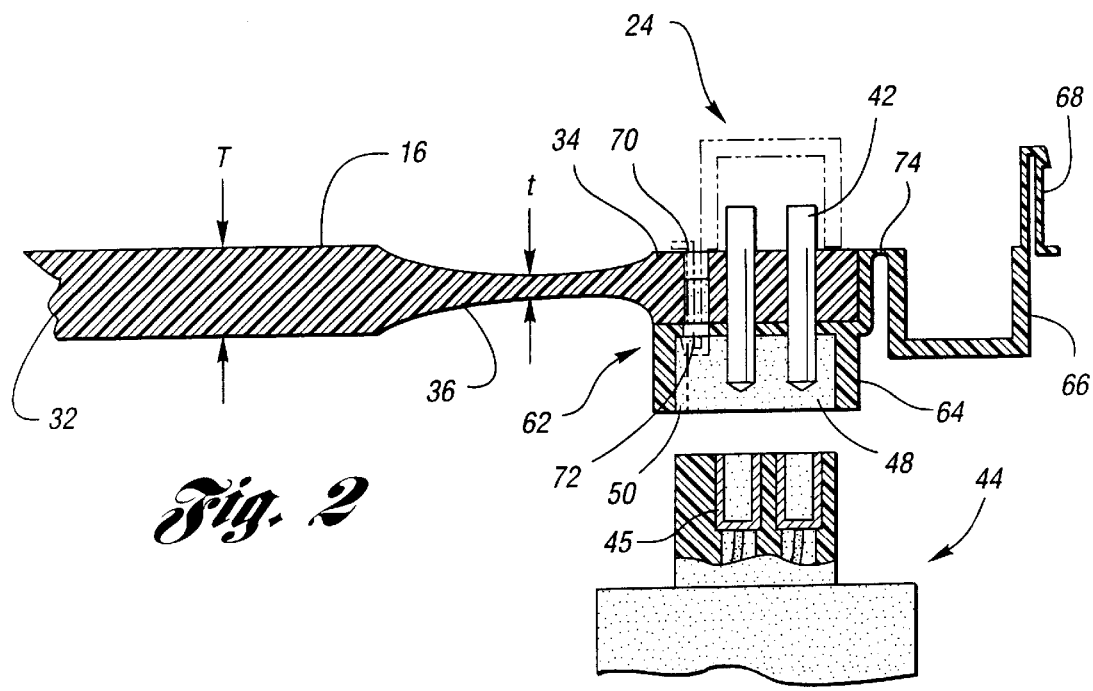
FIG. 2 is a side sectional view illustration an substrate and connector assembly according present invention and oriented to receive a mating socket module.

As shown in FIG. 1, and more clearly shown in FIGS. 2–3 discussed herein, unitary instrument panel substrate 12 has a molded thereto a relatively rigid main body portion 32 and a relatively rigid marginal edge portion 34. Unitary instrument panel substrate 12 further includes a thin flexible section 36, which is thin relative to rigid main body portion 32 and rigid marginal edge portion 34 to allow for flexibility. FIG. 2 illustrates a close-up view of a typical one of the connector assemblies shown previously in FIG. 1, such as cluster connector sub-assembly 24. Rigid main body portion 32 is shown in FIG. 2 as instrument panel 12 for a vehicle, discussed in FIG. 1. Of course, as previously noted, rigid main body portion 32 may also be any other substrate applicable to the type of use and the goal and objectives of the invention disclosed herein, such as consumer electronics goods.

Figure 3A:
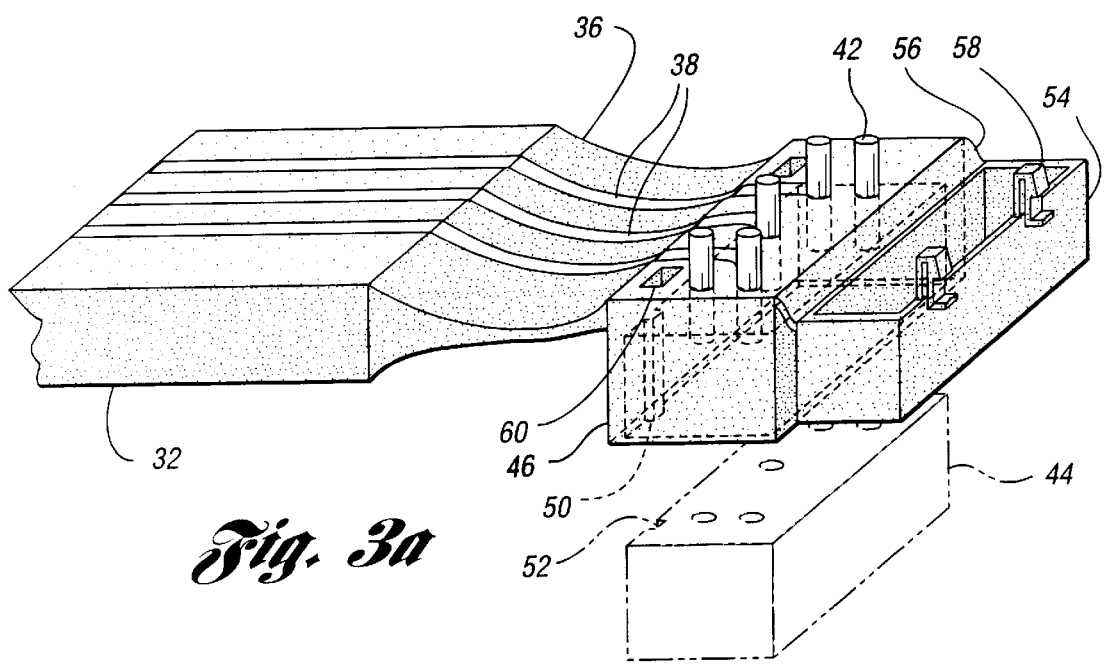
FIG. 3a is a perspective view illustrating a substrate and connector assembly according to the present invention having an open cover and oriented to receive a mating socket module.
Figure 3B:
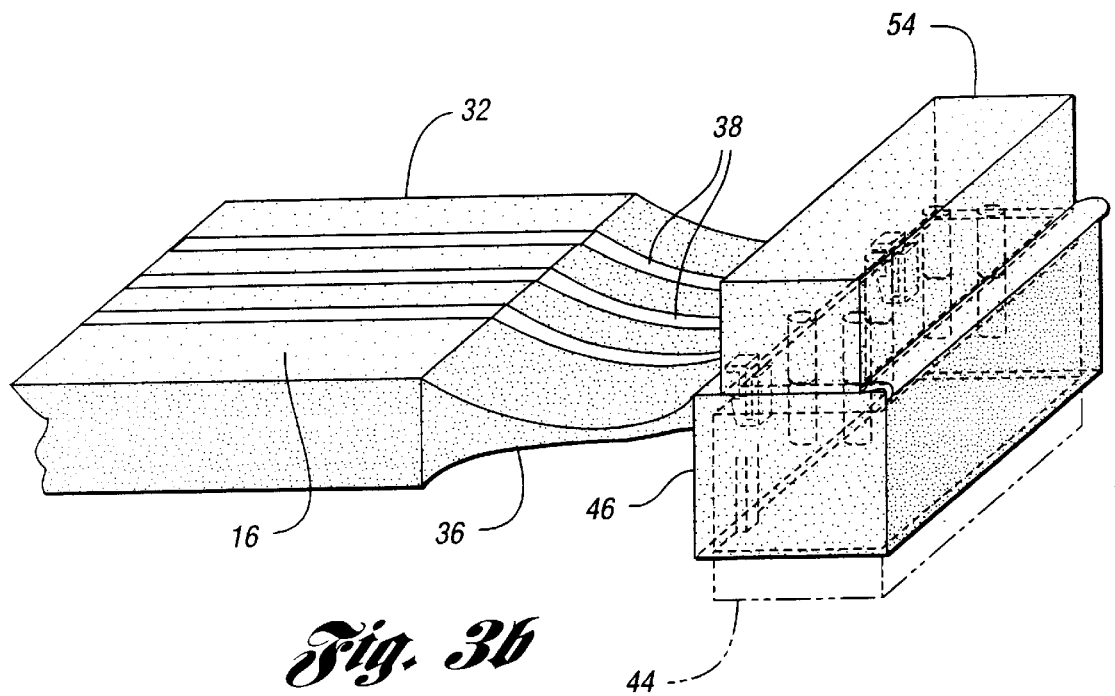
FIG. 3b is a perspective view illustrating a substrate and connector assembly according to the present invention having a closed cover and a mating socket module therein.

With reference to FIGS. 2, 3a and 3b, flexible section 36 extends between rigid main body portion 32 and rigid marginal edge portion 34. Flexible section 36 enables rigid marginal edge portion 34 to move relative to rigid main body portion 32. Flexible section 36 thus serves to provide a method for addressing misalignment between various mating electronic components and connectors, as well as differentials of thermal expansion between mating plastic materials, as well as normal vibration and shock. As shown in FIG. 2, the thickness of substrate main body portion 32 is designated by thickness dimension "T", while the thickness of flexible section 36 is designated by thickness dimension "t". While the ratio t/T should, of course, be less than 1.0, it is typically in the range of 0.25. Further, while marginal edge portion 34 should be of sufficient thickness to support and maintain the affixed terminals 40 (discussed herein), it is contemplated that marginal edge portion 34 can have thickness "T" similar to main body portion 32.

Further included in assembly 10 (or sub-assembly 24) is at least one conductive lead or trace 38 deposited on a surface 16 of the substrate 12. Lead 38 is typically in the form of a copper conductor trace. Of course, in most applications, there are provided a plurality of conductive leads 38. Conductive lead 38 extends from rigid main body portion 32 across flexible section 36 and to rigid marginal edge portion 34. Lead 38 carries electrical signals between the various previously discussed electrical components (not shown) connected to panel substrate 12.

Assembly 10 also includes at least one conductive terminal 40 which is affixed to rigid marginal edge portion 34. Generally, terminal 40 is a small metallic device which is attached to the end of a wire. Terminal 40 is preferably soldered to, but may be press-fit into, marginal edge portion 34. Conductive terminal 40 is in electrical connection with the at least one conductive lead 38. As with conductive lead 38, in most applications a plurality of conductive terminals 40 are provided, each corresponding to a respective conductive lead 38. Note that conductive terminal 40 is shown in FIGS. 1–3 as pin 42. As shown in FIGS. 1–2, flexible section 36, and marginal edge portion 34 having pin 42 inserted therein form connector sub-assembly 24. Connector sub-assembly 24 illustrated in FIGS. 1–3 is a multi-pin bulkhead and holds terminals 40 in position. It is contemplated that conductive terminal 40 may also be a socket 100, as more fully discussed herein in association with FIG. 4.

Figure 4:
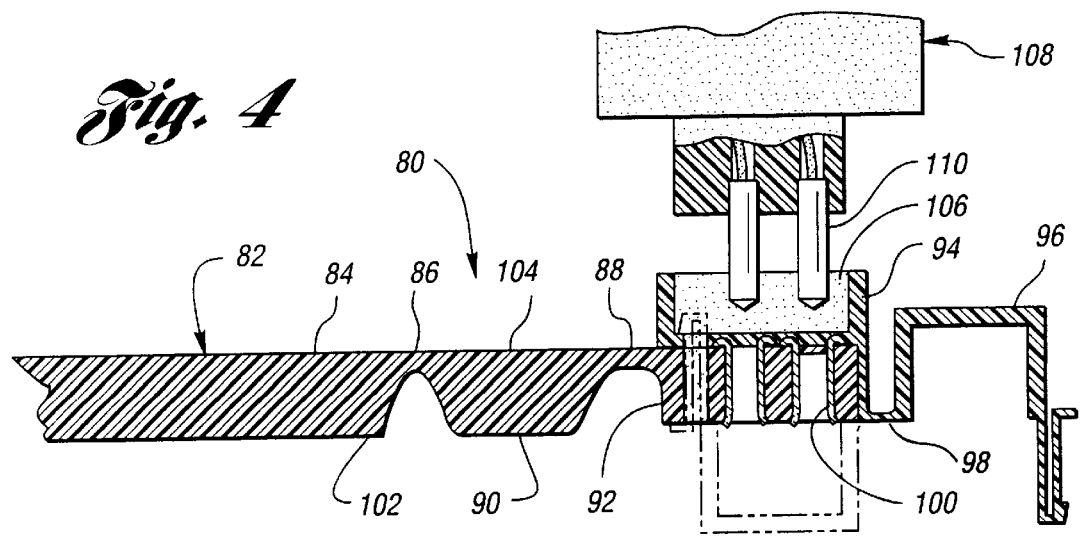
FIG. 4 is a side sectional view illustrating a second embodiment of a substrate and connector assembly according to the present invention.

The at least one conductive terminal 40 is adapted to receive a mating connector, more fully shown in FIGS. 2–3 as mating connector 44 and in FIG. 4 as mating connector 108. Mating connector 44 may be, among other things, part of a substrate, module, BUS, or other electronic component well-known in the art. As shown, mating connector 44 includes sockets 45 which receive pins 42, so that pins 42 and sockets 45 are biased against each other, thereby forming an electrical connection between a connector sub-assembly and mating connector.

As shown in FIGS. 1 and 3, assembly 10 may further include a housing 46 attached to rigid marginal edge portion 34. Housing 46 partially encloses or surrounds the at least one conductive terminal 40. Housing 46 has a housing opening 48 which receives mating connector 44. It is preferable that housing 46 is polarized, allowing it to receive mating connector 44 in a single orientation. As shown in FIGS. 3a and 3b, housing 46 may include a protrusion 50 which corresponds to a channel 52 in mating connector 44 so that mating connector 44 may only be inserted in a single orientation. Polarization through means such as protrusion 50 also minimizes the risk of attaching the wrong connectors together. It is also contemplated that mating connector 44 is fixedly locked into housing 46 upon insertion for a more secure connection.

A cover 54 is flexibly attached to housing 46 via a living hinge 56 which is also integrally molded into substrate 12, allowing cover 54 to be opened and closed freely. Cover 54 provides protection to the at least one conductive terminal 40 from both the elements and physical interferences. Cover 54 also allows the components such as terminal 40 to be serviced and maintained. Cover 54 may be integrally molded to either housing 46 and or instrument panel substrate 12. Through the use of hinge 56, cover 54 is capable of being folded over and snap-fitted into apertures or other openings in either instrument panel substrate 12 or housing 46 after the assembly of pins, sockets, and/or other terminals, etc. Again, cover 54 seals the connector's 24 terminals 40 and shields them from exposure to environmental and physical forces.

Pins 42 are conventionally "mass inserted" to instrument panel substrate 12 and are soldered thereto. Cover 54 provides protection to the metallic terminals 40 against corrosion and ensures better electrical connection. Since cover 54 is closed after assembly of pins 42, this makes the laying of conductive leads 38 on surface 16 of substrate 12 a relatively simple procedure by any of a number of procedures well-known in the art for depositing copper traces which will not be described in detail herein, such as such as etching, embossing, or laminating with or without adhesive. The insertion and assembly of pins 42 and/or sockets (discussed herein) into an uncovered connector 24 is performed with relative ease. In addition, note that cover 54 makes rework a fairly straight-forward process. Cover 54 includes fasteners or clips 58 so that when cover 54 is in a closed position, clips 58 are secured into corresponding clip openings 60 in housing 46 in a snap-fit. Of course, clips 58 may be secured into corresponding openings on rigid edge portion 34.

FIG. 3a illustrates a schematic illustration of connector sub-assembly 24 having cover 54 open, so that the terminals 40 such as pins 42, are visible and accessible. Further, in FIG. 3a, mating connector 44 is available to be accepted by housing 46. FIG. 3b illustrates a schematic view showing cover 54 closed over terminals 40 and mating connector 44 inserted into a housing opening 48 defined by housing 46. For ease of discussion and reference in FIG. 3b, inner components are shown in phantom lines.

FIG. 2 illustrates an integrally molded housing sub-assembly 62 comprising a housing portion 64, a cover portion 66 and hinge portion 74, which generally correspond to housing 46, cover 54 and hinge 74 as shown in FIG. 1. This housing sub-assembly 62 engages or is attached to substrate 12. In FIG. 2, housing portion 64 of sub-assembly 62 includes openings which form an interference fit or press-fit with pins 42, thereby securing sub-assembly 62 in place. In operation, when cover portion 66 of sub-assembly 62 is in a closed position (as shown in phantom in FIG. 2) through the use of hinge portion 74, clip portion 68 is inserted into a passage 70 in substrate 12 and then into a corresponding receiver opening 72 in housing portion 64.

FIG. 4 illustrates another embodiment according to the present invention. In FIG. 4, sub-assembly 80 is shown as including a substrate 82. Substrate 82 includes rigid main body portion 84, two flexible portions 86 and 88, a rigid intermediate portion 90 and rigid edge portion 92. Of course, it is contemplated that, based on the desired degree of flexibility, there may exist more than the two flexible portions 86 and 88 in sub-assembly 80. In this embodiment, housing 94, cover 96 and hinge 98 are formed from a different material than that which forms substrate 82. However, housing 94, cover 96 and hinge 98 are otherwise shown integrally molded to substrate 82. Of course, in this embodiment, the materials should have corresponding properties such as thermal expansion properties and the like so that the goals and objectives of the invention are achieved.

Also, the embodiment illustrated in FIG. 4 further shows sockets 100 as the conductive terminals which are insertably mounted to and preferably soldered to substrate 82 and the related leads (not shown in FIG. 4 but similar to those shown in FIGS. 3a–3b). Further, it is shown that cover 96 closes on the same side as surface 102, which is opposite surface 104. (Surface 104 corresponds to surface 16 upon which conductive leads 20 are laid as previously discussed in association with FIGS. 1–3). Accordingly, it is illustrated in FIG. 4 that housing 94 has a housing opening 106 for receiving a mating connector 108. In FIG. 4, mating connector 108 has at least one pin 110, each pin 110 correspondingly received by sockets 100. Of course, this embodiment may incorporate any and all of the features discussed herein, such as the polarized housing feature as previously discussed, designated by reference numbers 50 and 52.

With reference now to FIGS. 5–6, substrate and connector assembly 120 is shown, wherein unitary substrate 122 is shown as an instrument panel cluster for a motor vehicle instrument panel, and may correspond with and be received by cluster opening 18 of instrument panel 12. As previously stated, substrate 122 may be any substrate feasible for use in applications where it is desired that electronic connectors be molded thereto in order to negate the need for a bulky wiring harness. Again, by way of representative illustration only, this cluster is shown having a connector 144 and flexible section 130 integrally molded thereto by a process that would permit such molding, such as injection molding. Substrate 122 has attached to it electronic components (not shown) available to perform various functions of instrument cluster substrate 122. Because of these electronics, substrate contains numerous through-holes 124 for attachment of the electronic components (not shown).

As more clearly shown in FIG. 6, assembly 120 includes rigid main body portion 126, rigid marginal edge portion 128 and a flexible section 130. Flexible section 130 extends between rigid main body portion 126 and rigid marginal edge portion 128. Flexible section 130 enables rigid marginal edge portion 128 to move relative to rigid main body portion 126. As previously discussed, flexible section 130 thus serves to provide a means for curing misalignment between various mating electronic components and connectors, as well as curing differences in thermal expansion between mating plastic materials, and to accommodate other environmental factors such as vibration and shock.

Further included in assembly 120 is at least one conductive lead 132 deposited on a surface 134 of substrate 122. Lead 132 is typically in the form of a copper conductive trace. Again, as illustrated in FIG. 5, in most applications, substrate 122 is provided with a plurality of conductive leads 132. Conductive lead 132 extends from rigid main body portion 126 across flexible section 130 and to rigid marginal edge portion 128. Lead 132 carries electrical signals between the various electrical components previously discussed (not shown) which are connected to panel substrate 122.

Referring to FIG. 6, assembly 120 also includes at least one conductive terminal 136 which is affixed to rigid marginal edge portion 128. Conductive terminal 136 is preferably press-fit into marginal edge portion 128 and soldered thereto, each terminal 136 extending through marginal edge portion 128. Conductive terminal 136 is in electrical connection with the at least one conductive lead 132 in order to serve as an electrical connection between connector sub-assembly 144 and mating components (not shown in FIGS. 5–6). As with conductive lead 132, in most applications a plurality of conductive terminals 136 are provided, each corresponding to a respective conductive lead 132. Note that each conductive terminal 136 is shown in FIGS. 5–6 as a pin 138. Specifically, marginal edge portion 128 having pin 138 inserted therein forms connector sub-assembly 144. Connector sub-assembly 144 illustrated in FIGS. 5–6 is a multi-pin bulkhead and holds terminal 136 in position.

FIG. 6 illustrates a side elevational view of the assembly 120 of FIG. 5. As shown in the FIG. 6, connector sub-assembly 144 may further include a housing 142 and a cover 152. As shown therein, cover 152 is open so that the terminals 136, such as pins 138, are visible and accessible. Cover 152 is attached to housing 142 by hinge 154, which is preferably an integrally molded living hinge. Cover 152 includes fasteners or clips 156 so that when cover 152 is in a closed position (as discussed previously in association with FIGS. 2 and 3b), clips 156 are secured into corresponding clip openings 158 in housing 142 by a snap-fit or other appropriate closure. Of course, clips 156 may be secured into corresponding openings (not shown) in rigid edge portion 128.

As is further shown in FIG. 6, housing 142 and cover 152 are preferably integrally molded to substrate 122 and are formed of the same material as substrate 122. Of course, as previously shown in FIGS. 2 and 4, other types of attachments between housing 142 and cover 152 to substrate 122 are available.

While the best mode for carrying out the invention has been described in detail, those familiar with the art to which this invention relates will recognize various alternative designs and embodiments for practicing the invention as defined by the following claims.

What is claimed is:

1. A substrate and electrical connector assembly, comprising:
    a unitary, single layer substrate having a relatively rigid main body portion, a relatively rigid marginal edge portion, and a relatively thin flexible section extending between the rigid main body portion and the rigid marginal edge portion;
    at least one conductive lead deposited on and extending across a surface of the substrate from the rigid main body portion across the flexible section to the rigid marginal edge portion; and
    at least one conductive terminal affixed to the rigid marginal edge portion in electrical connection with the at least one conductive lead, whereby the at least one conductive terminal is adapted to receive a mating connector and the flexible section enables the rigid marginal edge portion to move relative to the rigid main body portion.

2. The substrate and electrical connector assembly of claim 1, wherein the at least one conductive terminal is a pin.

3. The substrate and electrical connector assembly of claim 1, wherein the at least one conductive terminal is a socket.

4. The substrate and electrical connector assembly of claim 1, further comprising a housing attached to the rigid marginal edge portion for partially enclosing the at least one conductive terminal.

5. The substrate and electrical connector assembly of claim 4, wherein the housing is polarized for receiving a mating connector in a single orientation.

6. The substrate and electrical connector assembly of claim 4, further comprising a cover attached to the housing for providing protection to the at least one conductive terminal.

7. The substrate and electrical connector assembly of claim 6, wherein the cover is snap-fit to the housing.

8. An instrument panel assembly comprising:
    an unitary instrument panel substrate having a relatively rigid body portion, a relatively rigid edge portion, and a flexible section extending between the rigid body portion and the rigid edge portion;
    a plurality of conductive leads positioned on a surface of the instrument panel substrate and extending from the rigid body portion across the flexible section to the rigid edge portion; and
    a plurality of conductive terminals affixed to the rigid edge portion in electrical connection with the plurality of conductive leads, whereby the plurality of conductive terminals are adapted to receive a mating connector, and the flexible section enables the rigid edge portion to move relative to rigid body portion.

9. The instrument panel assembly of claim 8, wherein the plurality of conductive terminals includes pins.

10. The instrument panel assembly of claim 8, wherein the plurality of conductive terminals includes sockets.

11. The instrument panel assembly of claim 8, further comprising a housing attached to the rigid edge portion for partially enclosing the at least one conductive terminal.

12. The instrument panel assembly of claim 11, wherein the housing is polarized for receiving a mating connector in a single orientation.

13. The instrument panel assembly of claim 11, further comprising a cover attached to the housing for providing protection to the plurality of conductive terminals.

14. The instrument panel assembly of claim 13, wherein the cover is snap-fit to the housing.

15. An integrally molded substrate and electrical connector assembly, the assembly comprising:

a substrate having a relatively rigid main body portion, a relatively rigid marginal edge portion, and a relatively thin flexible section extending between the main body portion and the marginal edge portion, wherein the main body portion, the marginal edge portion and the flexible section are integrally molded with the substrate;

a plurality of conductive leads disposed on a surface of the substrate and extending from the main body portion across the flexible section to the marginal edge portion;

a plurality of conductive terminals engaging the marginal edge portion in electrical connection with the plurality of conductive leads, whereby the plurality of conductive terminals is adapted to receive a mating connector and the flexible section enables the rigid marginal edge portion to move relative to rigid main body portion;

a housing attached to the rigid marginal edge portion for partially enclosing the plurality of conductive terminals; and a cover attached to the housing for providing protection to the plurality of conductive terminals.

* * * * *